United States Patent [19]
Nogami

[11] Patent Number: 5,073,873
[45] Date of Patent: Dec. 17, 1991

[54] SEMICONDUCTOR MEMORY DEVICE

[75] Inventor: Kazutaka Nogami, Tokyo, Japan

[73] Assignee: Kabushiki Kaisha Toshiba, Kawasaki, Japan

[21] Appl. No.: 439,870

[22] Filed: Nov. 21, 1989

[30] Foreign Application Priority Data

Nov. 21, 1988 [JP] Japan .................... 63-294401

[51] Int. Cl.⁵ .............................................. G11C 8/00
[52] U.S. Cl. ........................... 365/189.05; 365/230.08
[58] Field of Search .................. 365/189.05, 230.06, 365/230.08, 233

[56] References Cited
FOREIGN PATENT DOCUMENTS

| | | |
|---|---|---|
| 0096359A3 | 6/1983 | European Pat. Off. . |
| 0107394A2 | 9/1983 | European Pat. Off. . |
| 0199134A3 | 3/1986 | European Pat. Off. . |
| 63-46697 | 2/1988 | Japan . |
| 63-122089 | 5/1988 | Japan . |

Primary Examiner—Joseph A. Popek
Attorney, Agent, or Firm—Foley & Lardner

[57] ABSTRACT

This invention is directed to a device to decode a row address by a row decoder thereafter to latch the decoded signal by a latch circuit, thus allowing the latched signal to drive a memory cell in a memory cell array. Since respective addresses are latched after decoded as stated above, no decode time is included in one cycle time and the cycle time is therefore shortened.

18 Claims, 20 Drawing Sheets

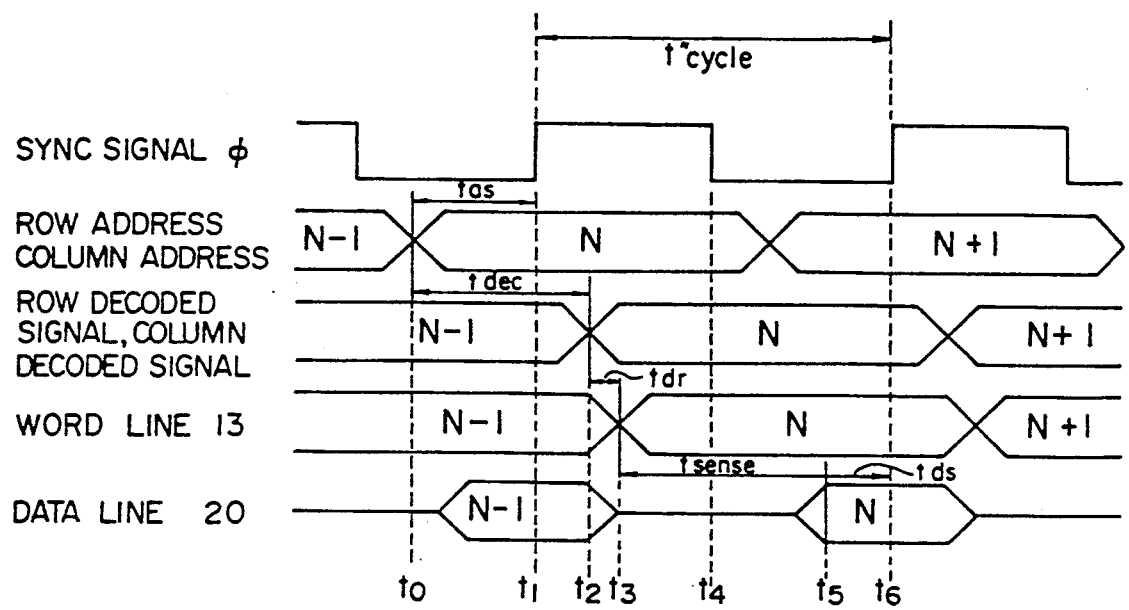
FIG. 10
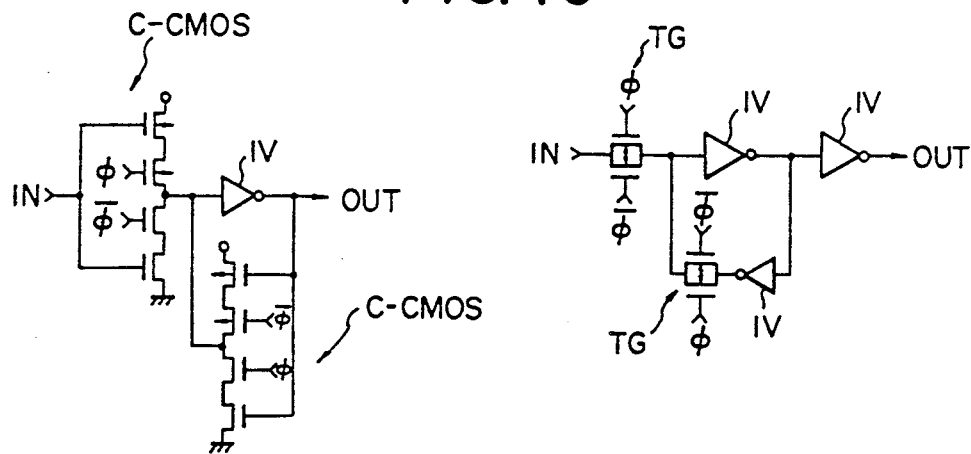
FIG. 11
FIG. 12

SEMICONDUCTOR MEMORY DEVICE

FIELD OF THE INVENTION

This invention relates to a semiconductor memory device, and more particularly to a synchronous semiconductor memory device such as a RAM or a ROM.

BACKGROUND OF THE INVENTION

A synchronous memory as the background art and its timing chart are shown in FIGS. 22 and 23, respectively. 10 A row address is applied to a latch 12 and is latched in synchronism with a synchronizing signal $\phi$. After the latch time $t_{\lambda at}$, this signal is applied to a row decoder 11. After an address decode time $t_{dec}$, the row decoder 11 applies a row decoded signal to a memory cell array 14 through one of the corresponding word lines 13, 13, ... On the other hand, a column address is applied to a latch 17, and is latched in synchronism with the synchronizing signal $\phi$. After the latch time $t_{\lambda at}$, this signal is applied to a column decoder 16. After the address decode time $t_{dec}$, the column decoder 16 applies a column decoded signal to an input/output circuit 19 to select one of corresponding bit lines 18, 18, When the row decoded signal is thus outputted to the corresponding word line 13, and the corresponding bit line 18 is selected in accordance with the column decoded signal, data from the memory cell array 14 is read out to the data line 20 after a sense time $t_{sense}$, with the data setup time $t_{ds}$ being ensured. The above-mentioned cycles are repeatedly executed. Thus, the readout of data corresponding to the respective addresses is sequentially executed.

Each of a series of cycle times $t_{cycle}$ is expressed as follows:

$$t_{cycle} = t_{\lambda at} + t_{dec} + t_{sense} + t_{ds} \quad (1)$$

It is seen from the above equation (1) and FIG. 23 that the address decode time $t_{dec}$ occupies a large ratio with respect to the entire cycle time $t_{cycle}$.

It is very important for the realization of a high speed memory to shorten the access time of the memory. Especially, for a high speed memory such as a high speed SRAM, etc., it is very advantageous that the cycle time be shortened.

SUMMARY OF THE INVENTION

This invention has been made in view of the above, and its object is to provide a semiconductor memory device having a short cycle time.

In accordance with this invention, a row address is first decoded at the row decoder. The signal thus decoded is latched at a latch circuit. The word line is driven by an output from the latch circuit.

Furthermore, in accordance with this invention, a section address is first decoded at the section decoder, and the signal thus decoded is latched at the latch circuit. Thus, a section select line is driven by an output from the latch circuit. Data read or write operation through an input/output circuit is applied to the specified cell defined by driving the corresponding word and section select lines.

In the above-described respective operations, respective addresses are latched after decoding. As a result, one cycle time includes no decode time. Thus, the cycle time is shortened.

Furthermore, in accordance with this invention, when a row address changes, a new row address is transmitted to the row decoder as it is through the master latch circuit at the latter half of one cycle of the synchronizing signal. The row decoder initiates the decoding operation. During this decoding operation, the synchronizing signal shifts to the next cycle. At the first half of the next cycle, the master latch circuit latches an input being inputted at that time (new row address). At the first half of the next cycle, the decoding operation of the row address is completed. The decoded signal drives the word line through the slave latch circuit.

Furthermore, in this invention, when there is a change in the section address, that new section address is transmitted through the master latch circuit to the section decoder as it is at the latter half of one cycle of the synchronizing signal. Thus, the section decoder initiates the decoding operation. During that decoding operation, the synchronizing signal shifts to the next cycle. At the first half of the next cycle, the master latch circuit latches an input being inputted at that time (new section address). At the first half of the next cycle, the decoding operation of the section address is completed. The decoded signal drives a section select line through the slave latch circuit. By driving the corresponding word and section select lines, double word line structure (driving) is implemented. Data read is conducted from a certain cell through the input/output circuit and data write is conducted into the cell therethrough.

In the above-described respective operations, the entire address decode time is not included in one cycle time, but a portion of the address decode time, i.e., only a time period from the time when the cycle of the synchronizing signal changes to the time when the address decoding is completed is included in one cycle time. Thus, the cycle time is shortened.

In accordance with this invention, row address decoding and data sensing are subjected to pipe-line processing. Thus, the cycle time in the semiconductor memory device can be shortened.

In addition, in accordance with this invention, the cycle time can be shortened also in a large capacity memory of the double word line structure.

BRIEF DESCRIPTION OF THE DRAWINGS

In the accompanying drawings:

FIG. 10 is a timing chart showing the operation of the second embodiment;

FIGS. 11 to 14 are actual circuit diagrams of the latch circuit shown in FIG. 7, respectively;

DESCRIPTION OF THE PREFERRED EMBODIMENTS

Figure 1:
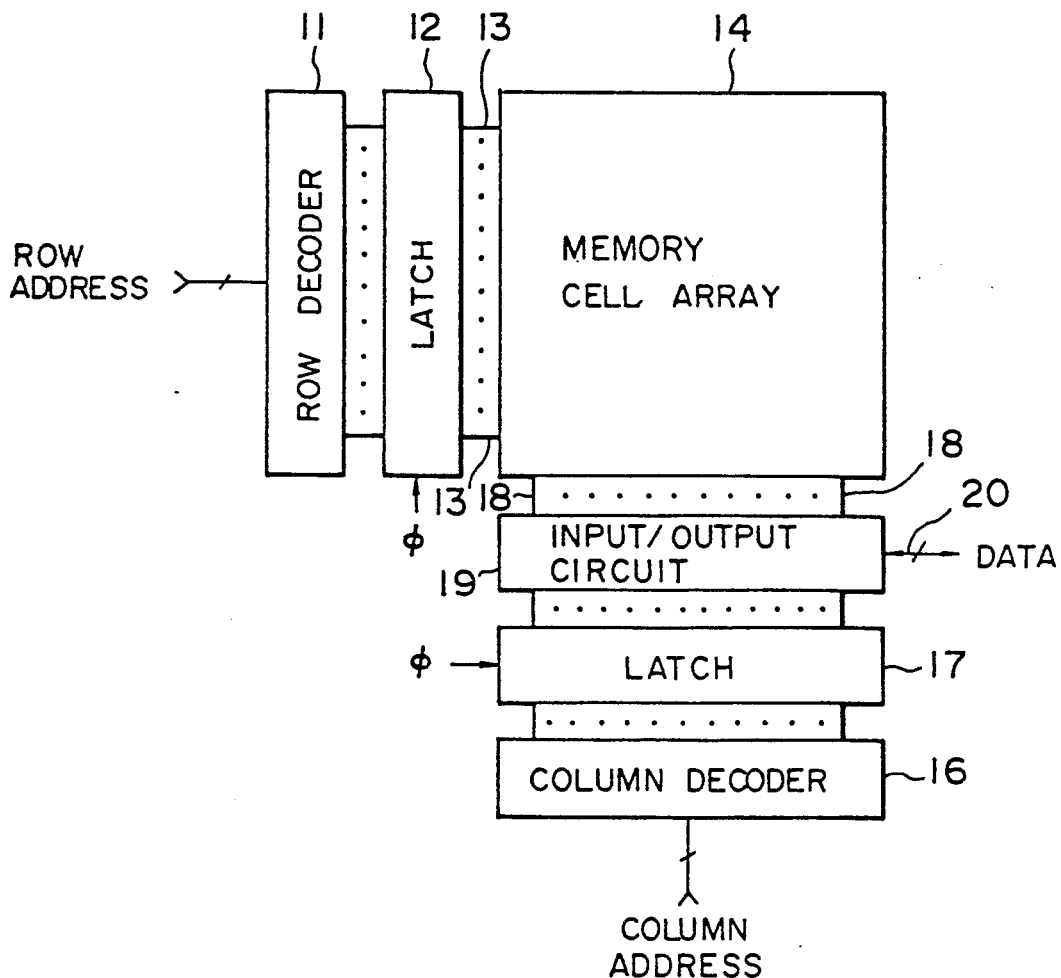
FIG. 1 is a block diagram of a first embodiment of this invention.

Initially referring to FIG. 1, there is shown a first embodiment of this invention. This embodiment differs from the background art in that after row and column addresses are decoded, they are latched and are then applied to the memory cell array. Namely, in the circuit arrangement shown in FIG. 1, the row address is applied to the memory cell array 14 through the row decoder 11, the latch 12, and a corresponding word line 13. On the other hand, the column address serves to select a corresponding bit line 18 through the column decoder 16, the latch 17, the input/output circuit 19.

Namely, more particularly, the row address is applied to the row decoder 11, and is then applied to the latch 12 as a row decoded signal. The latch 12 takes into a row decoded signal in synchronism with a synchronizing signal (clock) $\phi$ to drive a corresponding one of word lines 13, 13, ... On the other hand, the column address is applied to the column decoder 16, and is then applied to the latch 17 as a column decoded signal. The latch 17 takes into the column decoded signal in synchronism with the synchronizing signal $\phi$ to select, as a column select signal, a corresponding bit line 18 through the input/output circuit 19. When row and column decoded signals are thus applied to the memory cell array 14, data in a cell of an address corresponding to these decoded signals is outputted to the data line 20 through the bit line 18 and the input/output circuit 19. Alternatively, data from the external is written into the cell.

Figure 2:
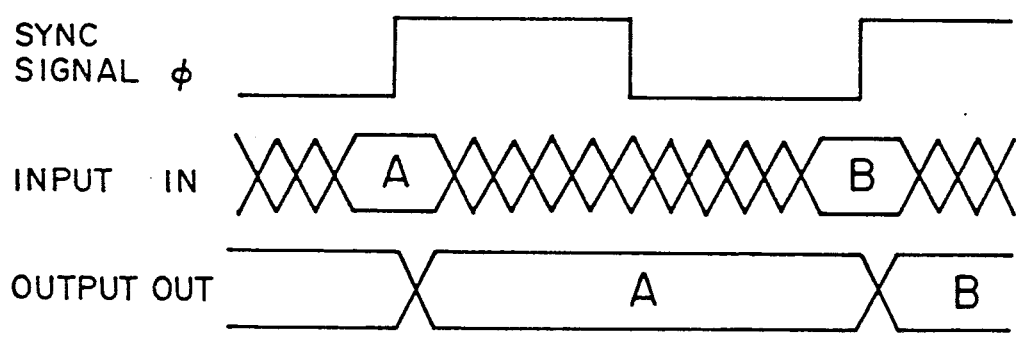
FIG. 2 is a timing chart showing the operation of each latch shown in FIG. 1.

Referring to FIG. 2, there is shown a timing chart showing the operation of the latches 12 and 17. These latches 12 and 17 take an input IN (A) thereinto in response to the rise of the synchronizing signal to output an output OUT (A). This output (A) is maintained during one cycle of the synchronizing signal. These latches 12 and 17 take an input IN (B) thereinto in response to the next rise of the synchronizing signal $\phi$ to output the output (B) in place of the output OUT (A) until now.

Figure 3:
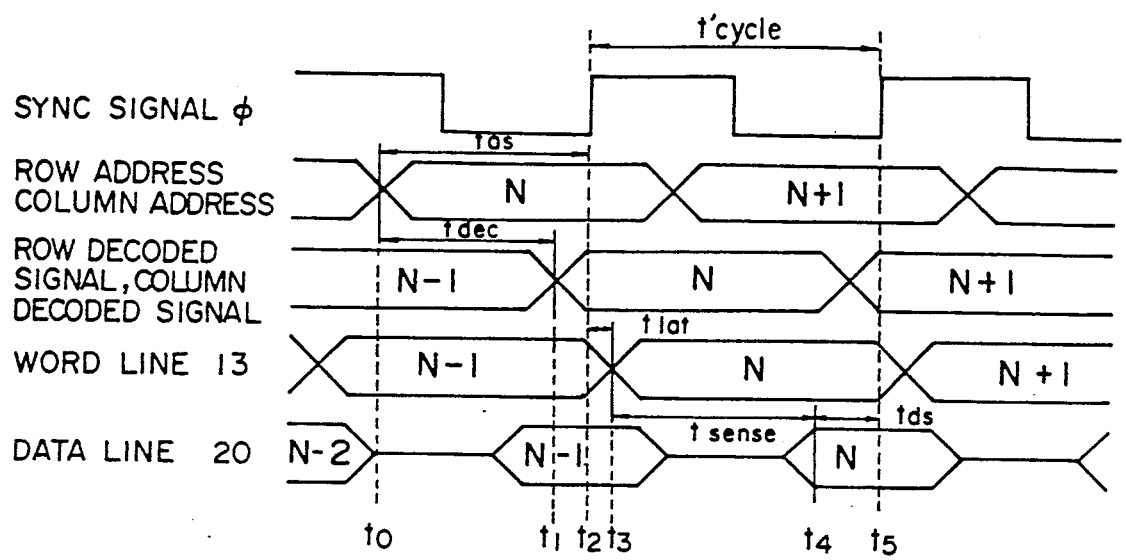
FIG. 3 is a timing chart showing the operation of the first embodiment.

Referring to FIG. 3, there is shown a timing chart showing the read operation of the memory.

When row and column addresses are applied at time $t_0$, row and column decoded signals are defined at time $t_1$ when the address decode time $t_{dec}$ has passed In response to the rise Of the synchronizing signal $\phi$ at time $t_2$ subsequent thereto, the row and column decoded signals previously defined are taken into the latches 12 and 17, respectively. At time $t_3$ when the latch time $t_{\lambda at}$ has passed, the word line 13 is driven and a corresponding bit line 18 is selected by the column select signal. At time $t_4$ when the data sense time $t_{sense}$ has passed from the time $t_3$, data is outputted to the data line 20. At time $t_5$ when the data setup time $t_{ds}$ has passed from the time $t_4$, execution of one cycle is completed.

In this case, the cycle time $t'_{cycle}$ is expressed by the following equation:

$$t'_{cycle} = t_{\lambda at} + t_{sense} + t_{ds} \tag{2}$$

When a comparison between the equation (2) and the abovementioned equation (1) is made, the equation (2) does not include the address decode time $t_{dec}$ which is included in the equation (1). Namely, it is seen that the cycle time $t'_{cycle}$ is shorter than the cycle time $t_{cycle}$ by the time $t_{dec}$. Generally, in high speed memories, the address decode time $t_{dec}$ occupies about 50% of the access time (cycle time $t_{cycle}$). For this reason, when a technique is used such that no address decode time $t_{dec}$ is included in the cycle time $t'_{cycle}$ as the equation (2), the cycle time $t'_{cycle}$ expressed as the equation (2) can be set to a value of about one half of the cycle time $t_{cycle}$ expressed as the equation (1).

For the above-mentioned latches 12, 17, a dynamic latch circuit or a static latch circuit may be used. For the dynamic latch circuit, e.g., circuits as shown in FIGS. 4 and 5 may be used.

Figures 4, 5:
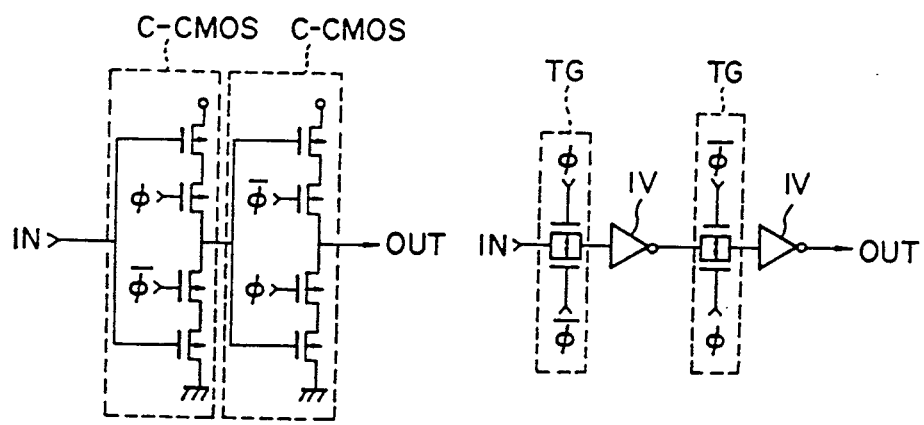
FIGS. 4 to 7 are actual circuit diagrams of the latch circuit shown in FIG. 1, respectively.

In the circuit arrangement shown in FIG. 4, a clocked CMOS (C-CMOS) structure is employed. This circuit is constructed as a dynamic circuit of a structure consisting of two C-CMOSs.

On the other hand, in the circuit arrangement shown in FIG. 5, a transfer gate TG structure of the CMOS type is used as the switch circuit. This circuit is constructed as a dynamic circuit of a structure consisting of two transfer gates TG and two inverters IV.

Figure 6:
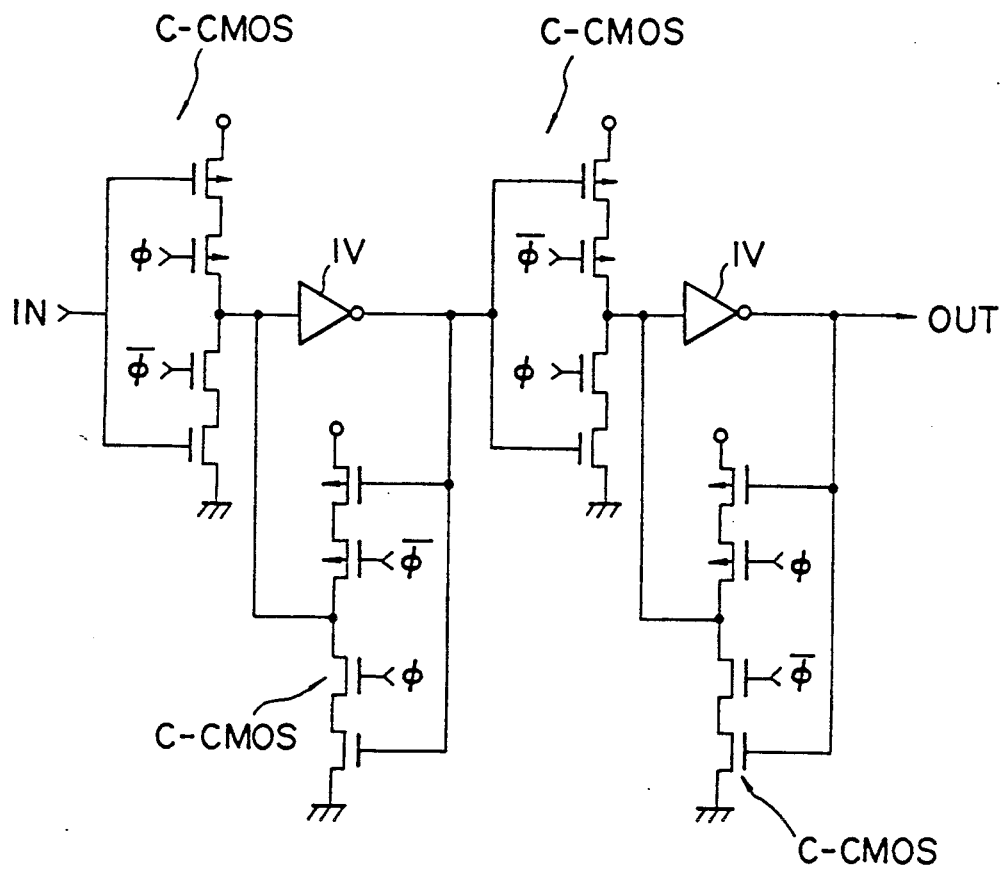
Figure 7:
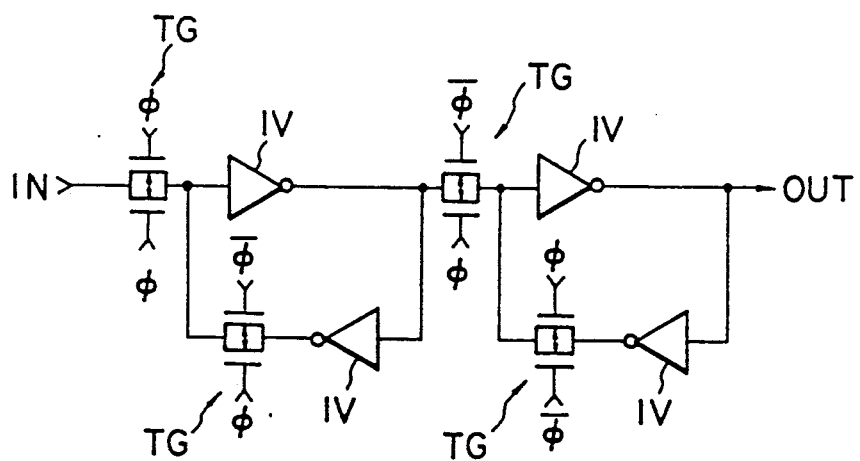

For the static latch circuit, e.g., circuits as shown in FIGS. 6 and 7 may be used.

The circuit shown in FIG. 6 is constructed as a static latch circuit of a structure such that loop circuits each consisting of an inverter IV and a C-CMOS are connected to the respective output sides of the two C-CMOSs of the latch circuit shown in FIG. 4.

The circuit shown in FIG. 7 is constructed as a static latch circuit of a structure in which feedback is applied to respective two inverters of the latch circuit shown in FIG. 5 by the series circuit including an inverter IV and a transfer gate TG.

It is to be noted that the latches 12, 17 shown in FIG. 1 are not limited to the latch circuit shown in FIGS. 4 to 7.

Figure 8:
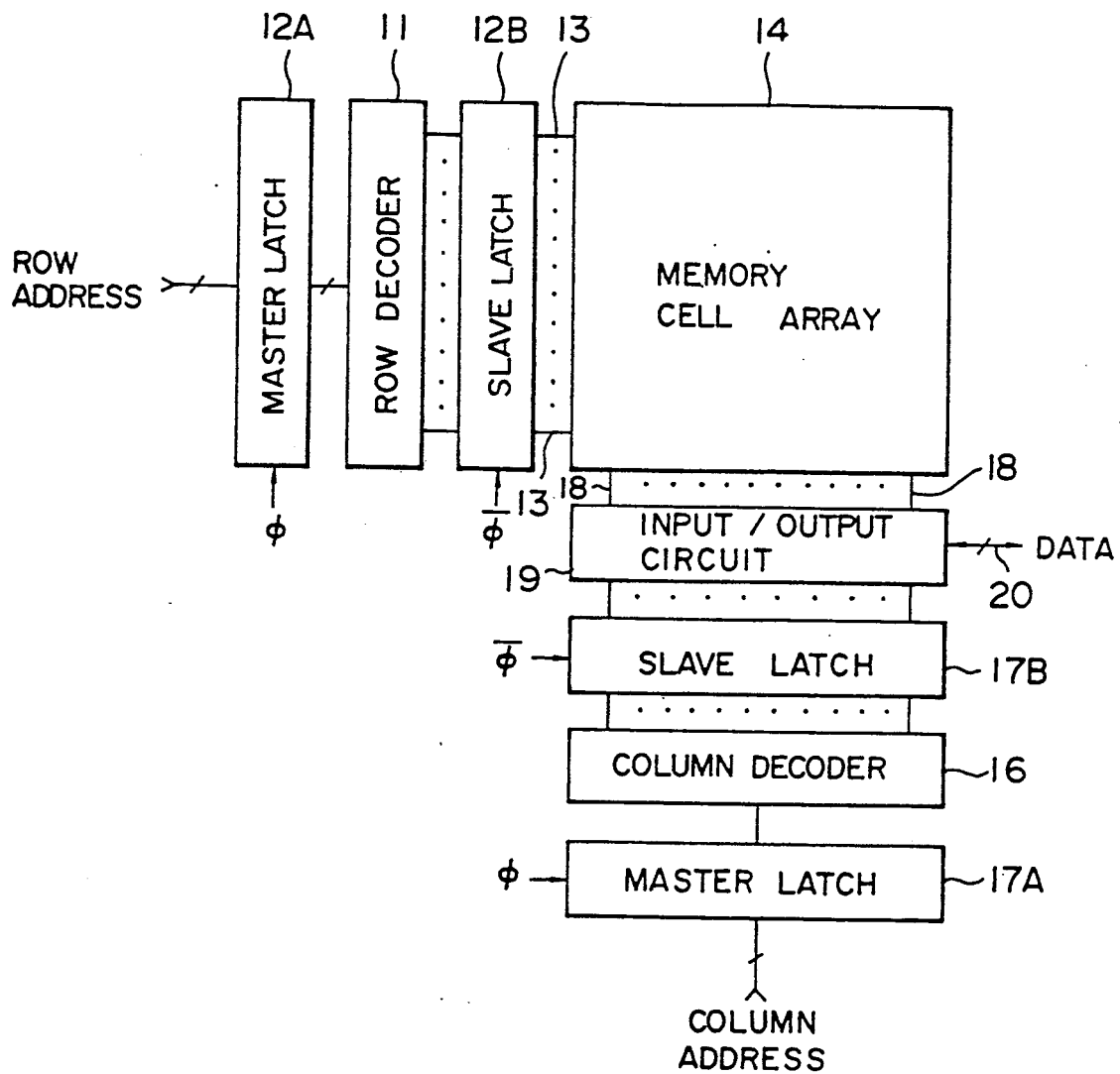
FIG. 8 is a block diagram showing a second embodiment of this invention.

Referring to FIG. 8, there is shown a second embodiment of this invention. This figure shows the circuit arrangement in the case where the address setup time $t_{as}$ (see FIG. 3) is shorter than the address decode time $t_{dec}$ (see FIG. 3). In the circuit arrangement shown in FIG. 8, the latch operation on the row side is carried out by the master latch 12A and the slave latch 12B, and the latch operation on the column side is carried out by the master latch 17A and the slave latch 17B. A row address is applied to the memory array 14 through the master latch 12A, the row decoder 11, the slave latch 12B, and the word line 13. In addition, a column address serves to select a corresponding bit line 18 through the master latch 17A, the column decoder 16, the slave latch 17B, and the input/output circuit 19.

Namely, in more detail, the master latches 12A and 17A latch respectively outputs for a time period during which the synchronizing signal $\phi$ is at the H level, and output respective inputs as they are for a time period during which the synchronizing signal $\phi$ is at the L level. The slave latches 12B and 17B latch respective outputs for a time period during which the synchronizing signal $\bar{\phi}$ is at the H level (i.e., the synchronizing signal $\phi$ is at the L level), and output respective synchronizing signal $\bar{\phi}$ is at the L level (i.e. the synchronizing signal $\phi$ is at the H level). Namely, at the first half of the cycle time, outputs from the master latches 12A and 17A are latched, and the slave latches 12B and 17B output their respective inputs as they are. On the other hand, at the latter half of the cycle, the master latches 12A and 17A output their inputs as they are, and the slave latches 12B, 17B latch their outputs.

Figure 9:
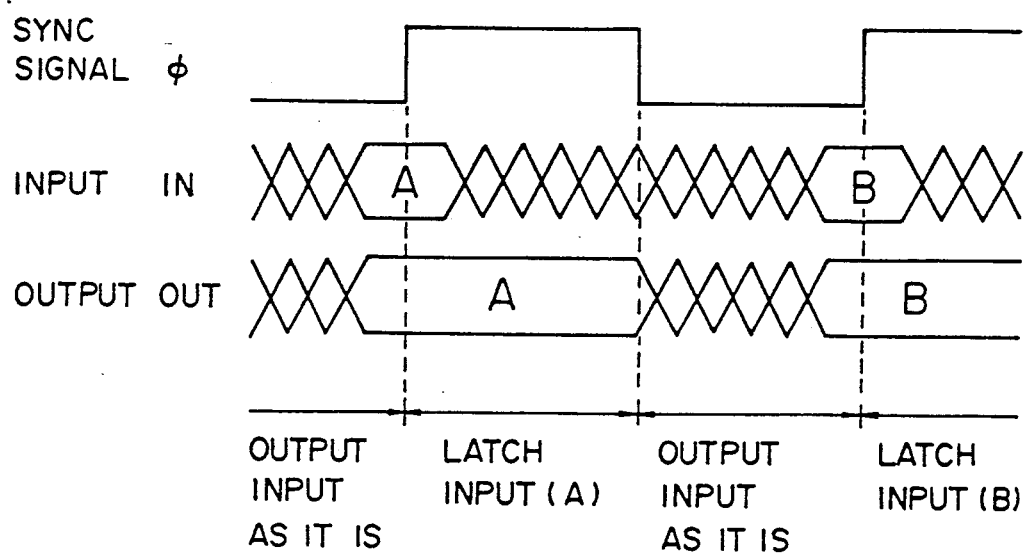
FIG. 9 is a timing chart showing the operations of respective latches shown in FIG. 8.

FIG. 9 is a timing chart showing the operation of the master latches 12A, 17A. The latches 12A, 17A take thereinto values of its input IN (A) in response to the rise of the synchronizing signal $\phi$, and maintains its output (A) for a time period during which the synchronizing signal $\phi$ is at the H level. When the synchronizing signal $\phi$ shifts to the L level, the above-mentioned latches output respective applied inputs IN as they are. Furthermore, when the synchronizing signal $\phi$ shifts to the H level for a second time, they take thereinto the value of input IN (B), and maintain the value (B) for a time period during which the synchronizing signal $\phi$ is at the H level.

FIG. 10 is a timing chart showing the read operation of the memory shown in FIG. 8. At time $t_0$ in a cycle just before the read cycle ($t''_{cycle}$), row and column addresses are defined At this time $t_0$, the synchronizing signal $\phi$ is at the L level. Thus, row and column addresses (N) are passed through the master latches 12A, 17A as they are, and are then applied to the row and column decoders 11 and 16. Thus, decoding operation is initiated in respective decoders 11, 16. At time $t_1$ before completion of the decoding operation, the synchronizing signal $\phi$ shifts to the H level. Thus, the master latches 12A, 17A latch their outputs. These outputs thus latched remain in form of the row and column addresses (N) applied at the time $t_0$. On the basis of these outputs, decoding operation is successively carried out at the decoders 11, 16. At time $t_2$ when the address decode time $t_{dec}$ has passed from the time $t_0$, the decoding operation is completed. Each decode signal outputted from the row and address decoders 11, 16 changes to the decode signal (N). At this time $t_2$, the synchronizing signal $\phi$ is at the H level. Thus, outputs from respective decoders 11, 16 are passed through the slave latches 12B, 17B as they are. As a result, a decoded signal (N) is outputted to the word line 13 at time $t_3$ when the word line drive time $t_{dr}$ has passed, and is defined. Thereafter, at time $t_5$ when the sense time $t_{sense}$ has passed, data (N) is outputted to the data line 20, and is defined. This status is continued for a setup time $t_{ds}$. At time $t_6$, the synchronizing signal $\phi$ shifts to the H level. Thus, the cycle time $t''_{cycle}$ is completed. At times subsequent thereto, the abovementioned operations will be repeatedly carried out.

The above-mentioned time $t''_{cycle}$ is expressed by the following equation.

$$t''_{cycle} = t_{dec} + t_{dr} + t_{sense} + t_{ds} - t_{as} \quad (3)$$

In this instance, since the time $t_{dr}$ for driving the word line 13 is nearly equal to the latch time $t_{\lambda at}$ in the above-described equation (1), the relationship expressed as the following equation is derived.

$$t''_{cycle} = t_{cycle} - t_{as} \quad (4)$$

Accordingly, it is seen that the cycle time $t''_{cycle}$ in the case of FIG. 8 is shorter than the cycle time $t_{cycle}$ of the background art by the address setup time $t_{as}$.

For respective latches 12A, 12B, 17A, 17B Of FIG. 8, circuit configuration shown in FIG. 11 or 12 may be used.

FIG. 11 is a static latch circuit using the clocked CMOS (C-CMOS) as a switch circuit. FIG. 12 is a static latch circuit using a transfer gate TG of the CMOS type as a switch circuit.

Figures 13, 14:
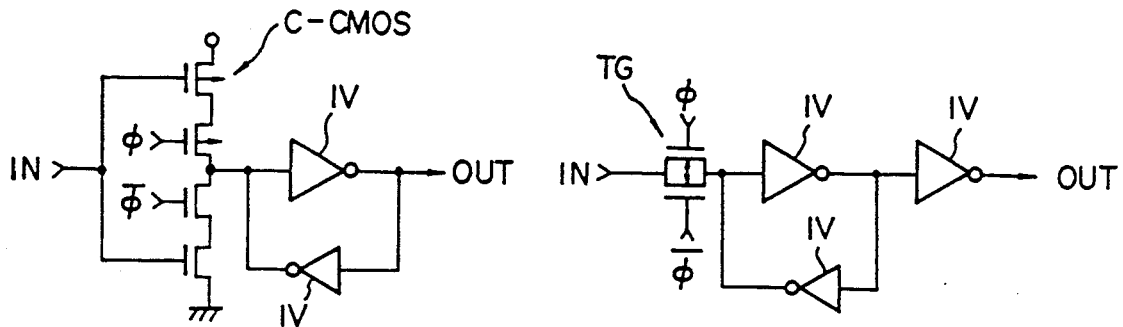

FIGS. 13 and 14 show static latch circuits which comprise feedback circuits having no switch circuit (clocked CMOS or transfer gate). In these circuits, the drive forces of the feedback circuits are made to be weak, and inputs are inversed by the switch circuits of the first stages.

Namely, as respective latches 12A, 12B, 17A, 17B in FIG. 8, the circuit configurations shown in FIGS. 11 to 14 may be used. When such latches are used as the master latch, it is sufficient to apply synchronizing signals $\phi$ and $\bar{\phi}$ to the terminals thereof as shown in respective figures. Furthermore, when such latches are used as the slave latch, it is sufficient to apply synchronizing signals $\bar{\phi}$ and $\phi$ to the terminals thereof in a manner opposite to that in connection with the case of the master latch. The above-described respective latches are not limited to the circuit configuration shown in FIGS. 11 to 14.

Figure 15:
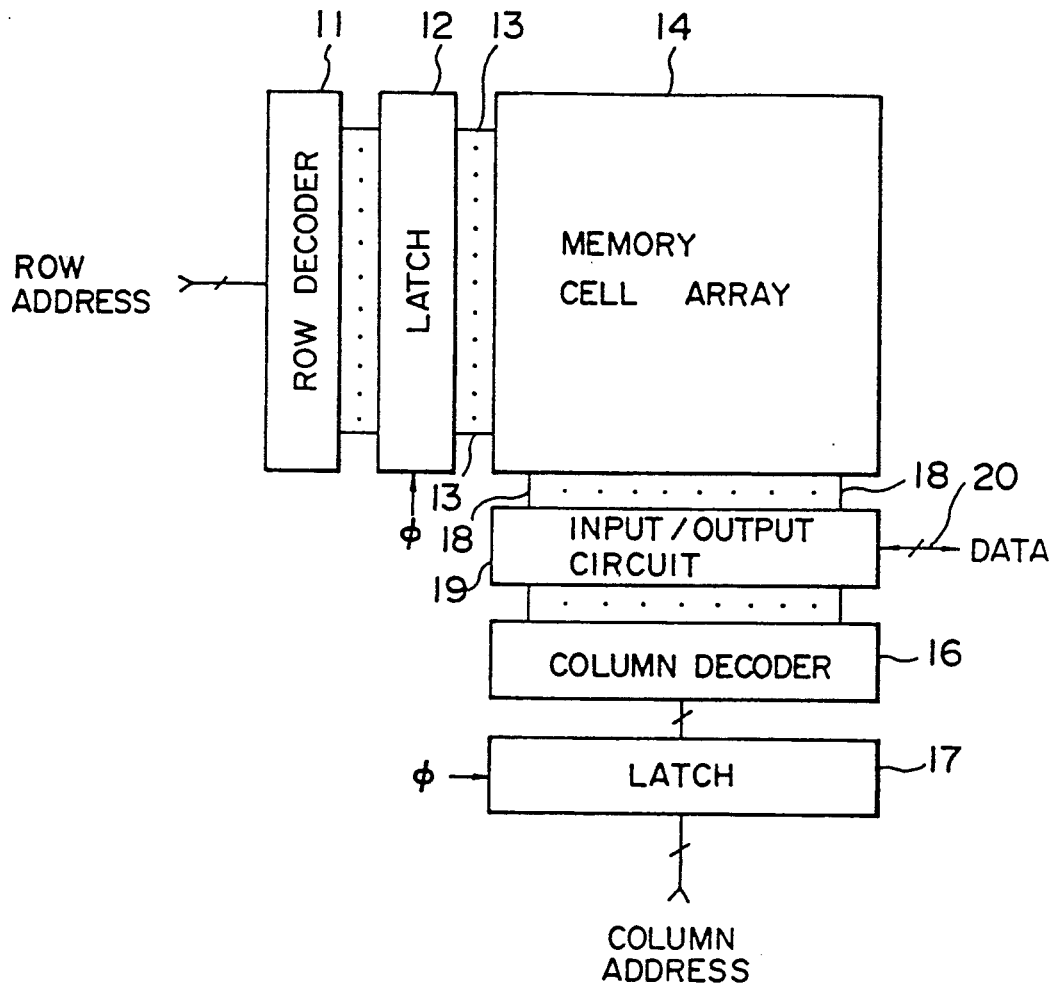
FIGS. 15 to 21 are block diagrams showing other embodiments different from each other of this invention, respectively.
Figure 16:
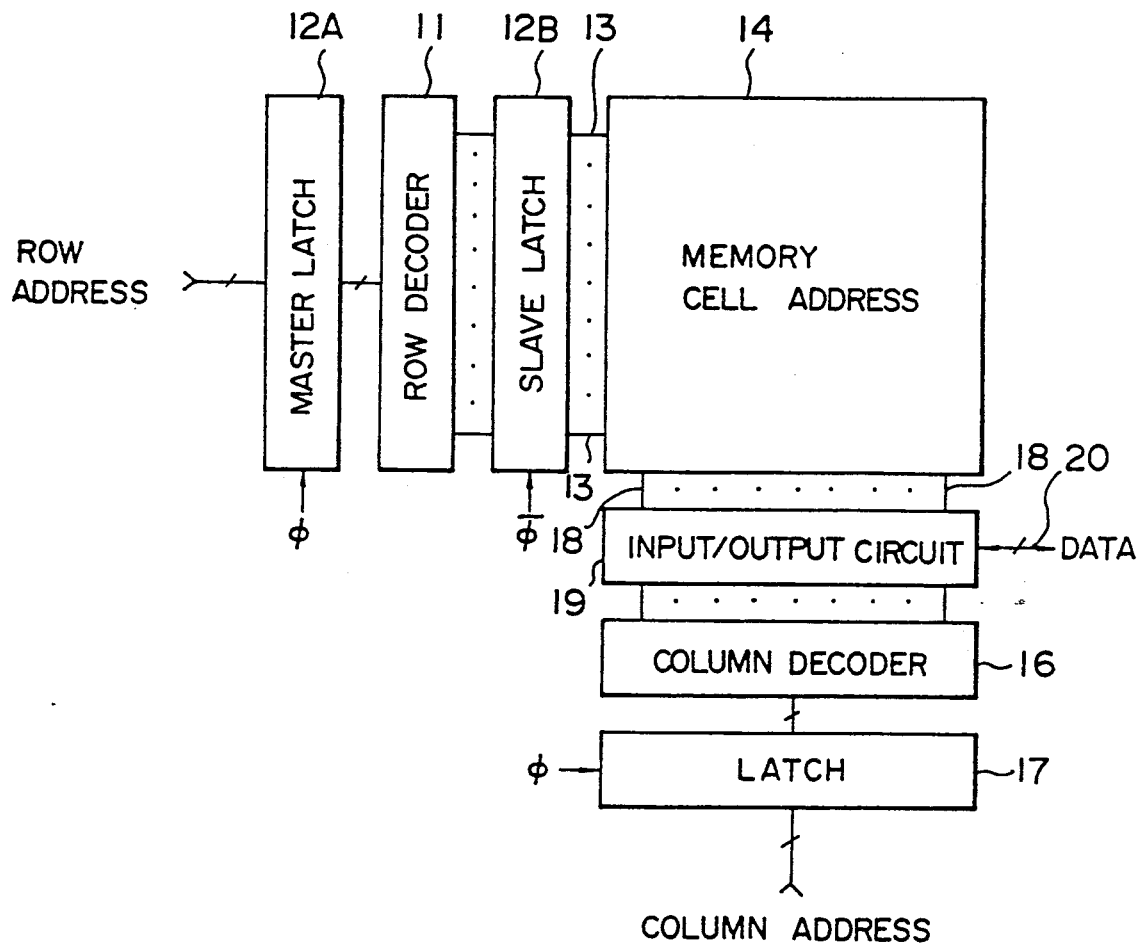
Figure 22:
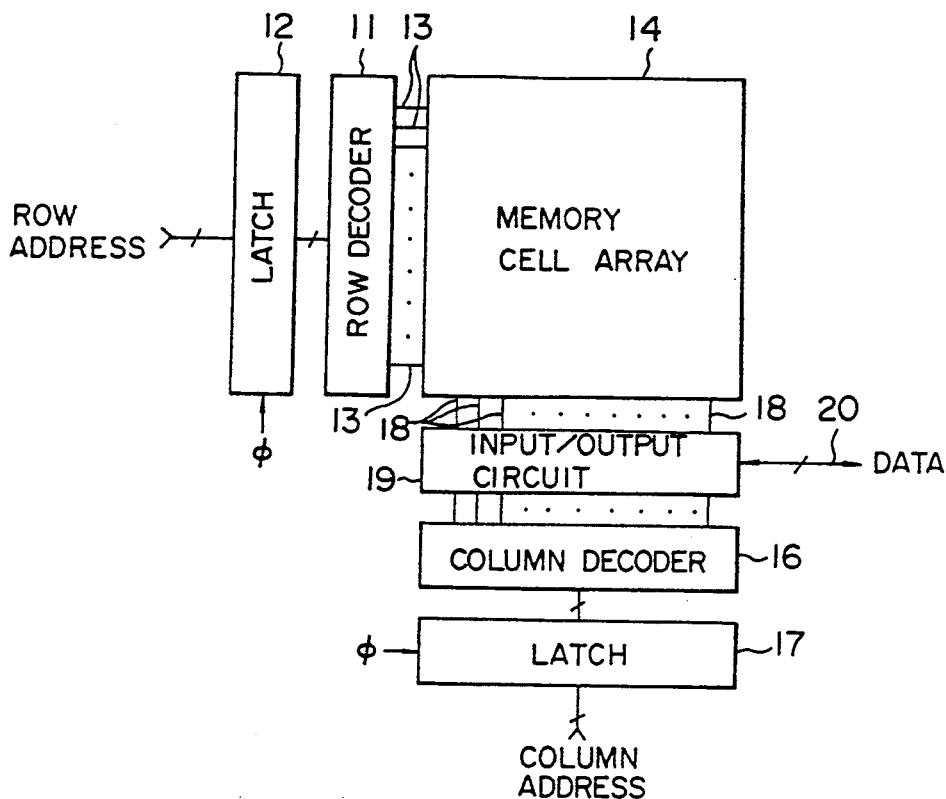
FIG. 22 is a block diagram of a background art.
Figure 23:
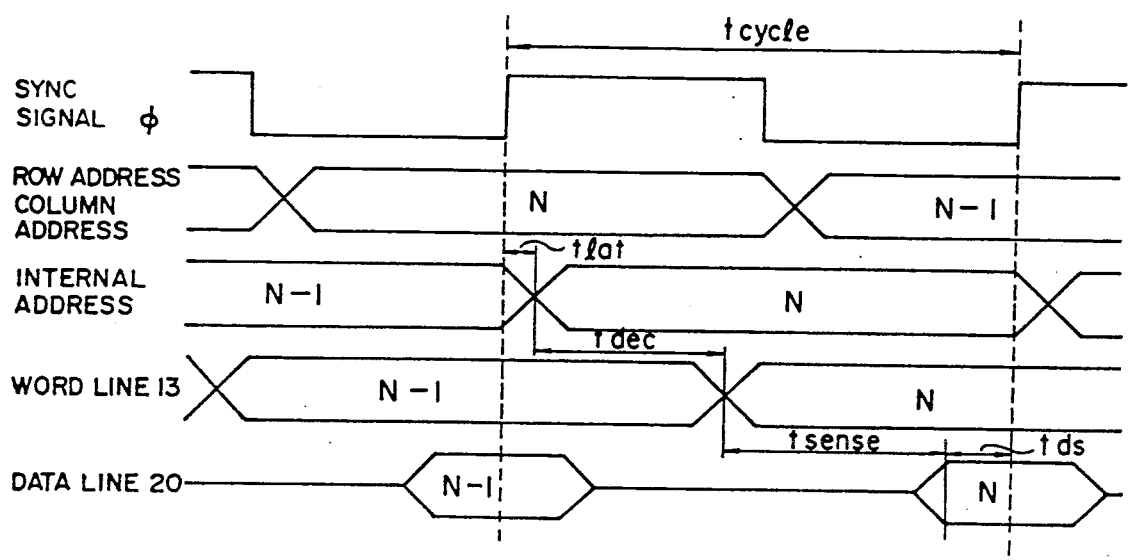
FIG. 23 is a time chart showing the operation of the background art shown in FIG. 22.
Figure 24:
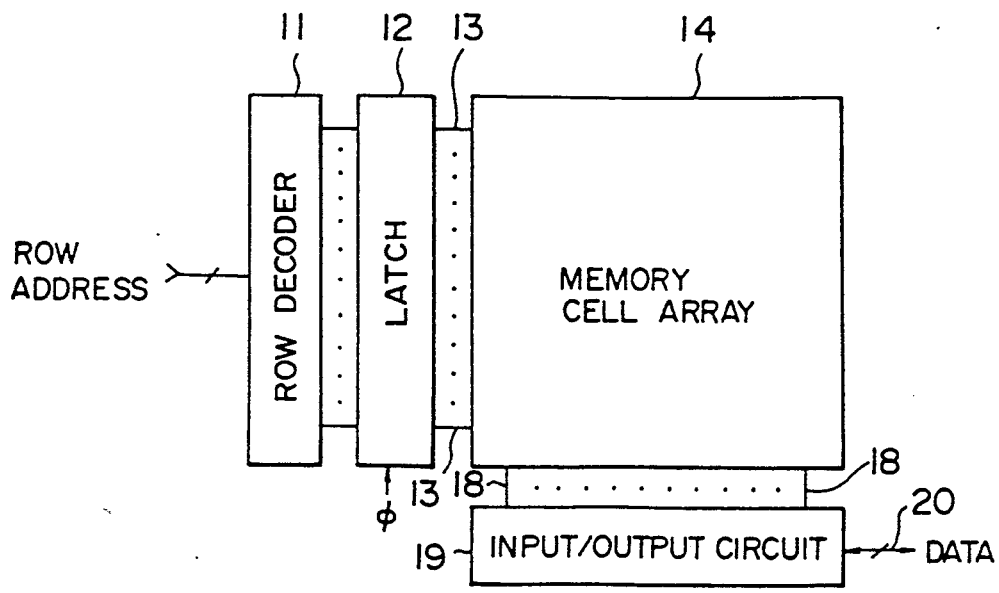
FIGS. 24 to 26 are block diagrams of modified embodiments shown in FIGS. 1, 8 and 17, respectively.
Figure 25:
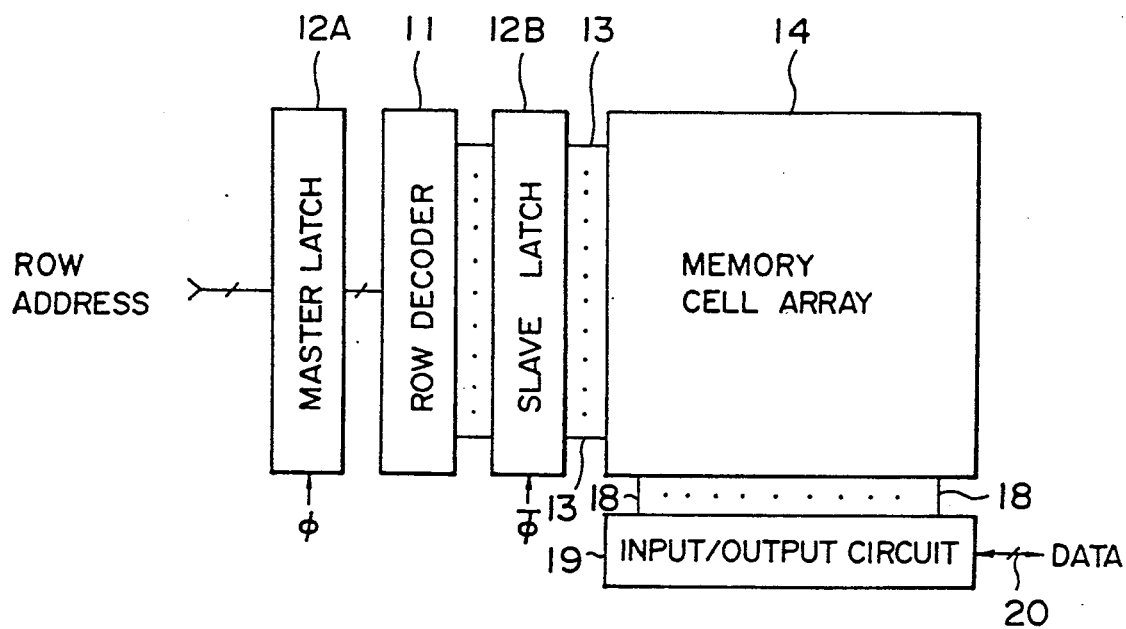
Figure 26:
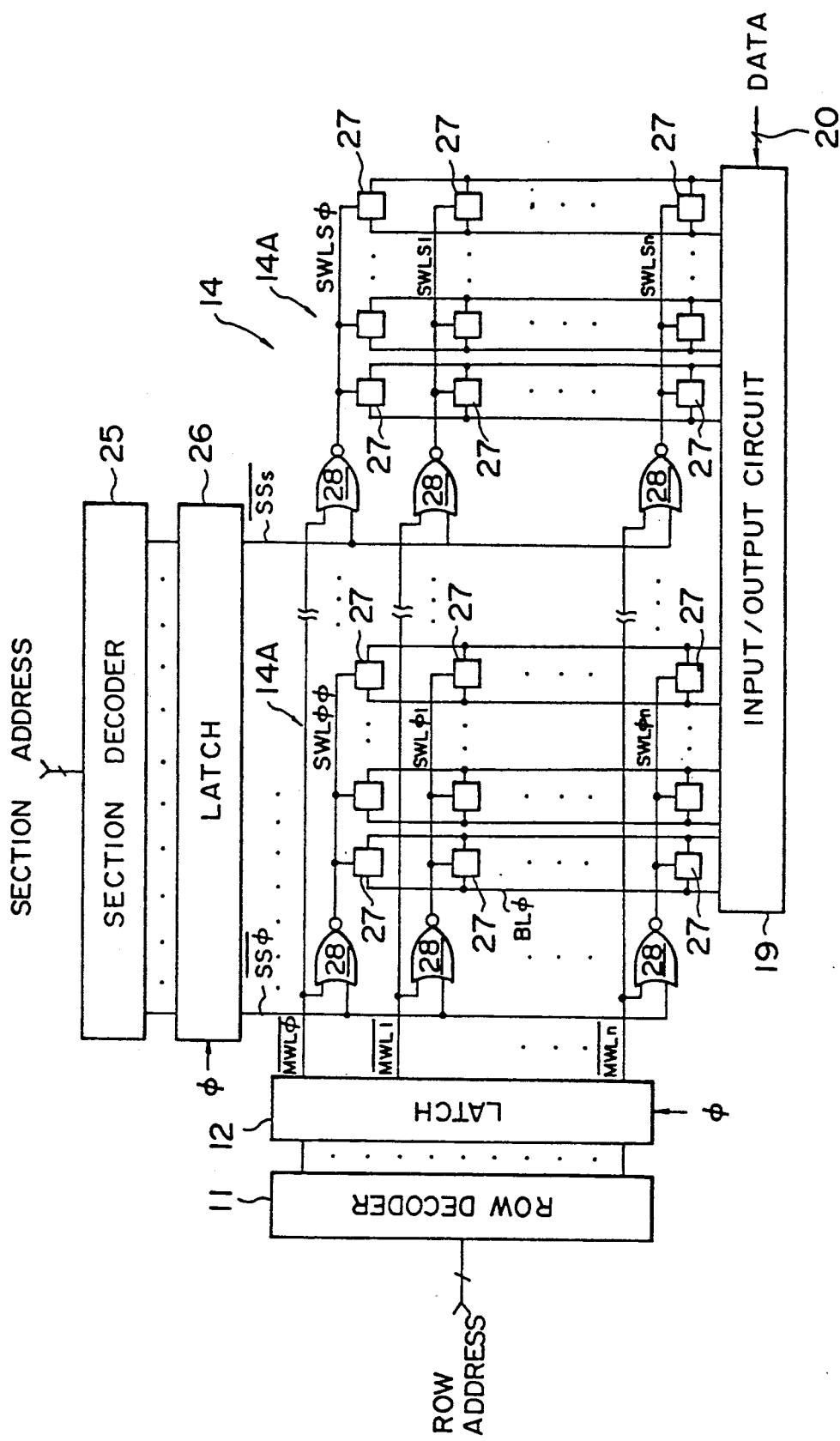

It is required for shortening the cycle time to allow row decoding operation to be independent of the sensing of data, i.e., to execute pipe-line processing. Thus, it is not necessarily required to construct the column system as a pipe-line configuration. Accordingly, the column system may adopt the same circuit configuration as that of the background art shown in FIG. 22. Examples where only the row system is subjected to pipe-line processing are shown in FIGS. 15 and 16, respectively. The circuit shown in FIG. 15 is characterized in that the same circuit configuration as that in FIG. 22 is employed as the column system in the circuit configuration shown in FIG. 1. Furthermore, the circuit shown in FIG. 16 is characterized in that the same circuit configuration as that in FIG. 22 is employed as the column system in the circuit configuration shown in FIG. 8.

It is to be noted that, in the circuit configurations shown in FIGS. 15 and 16, components designated by the same reference numerals as those in FIGS. 1, 8, and 22 denote the same components as those components, respectively.

Some large capacity static RAMs adopt the double word line structure. This invention is applicable to memories of such a double word line structure, thus making it possible to realize a shortened cycle time.

Figure 17:
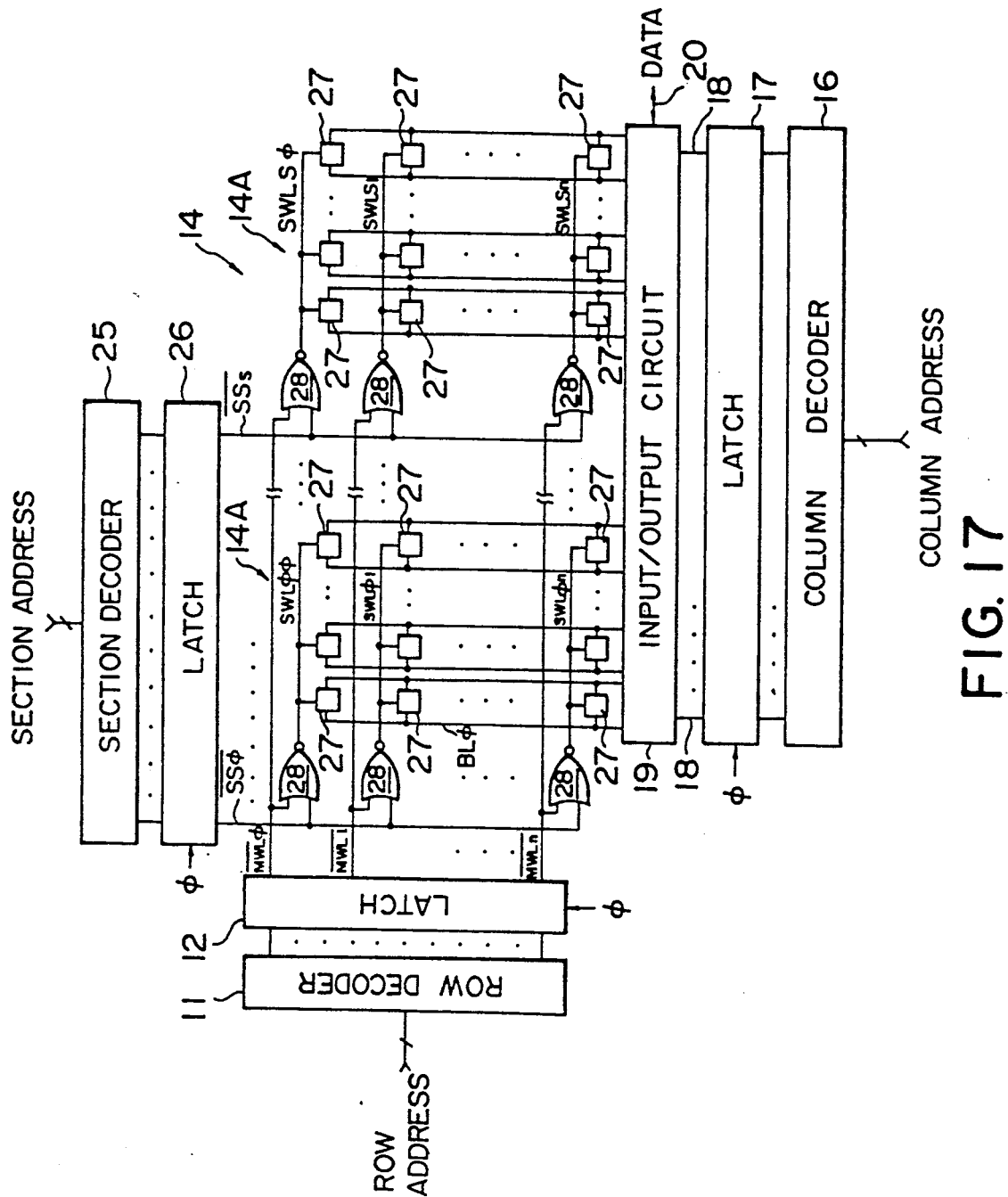

An embodiment of this kind is shown in FIG. 17. A latch 12 is provided at the next stage of the row decoder 11, thus to drive main word lines $\overline{MWL\phi}$, ..., $\overline{MWLn}$. The memory cell array 14 is divided into several subarrays 14A, 14A, Selection of respective subarrays 14A is carried out by a section decoder 25. Namely, a latch 26 is provided at the next stage of the section decoder 25. Section select lines $\overline{SS\phi}$, ..., $\overline{SSs}$ are driven by outputs from the latch 26. Word lines $SWL\phi\phi$, $SWL\phi n$, ..., $SWLS\phi$, $SWLSn$ connected to respective memory cells 27, 27, ... are output lines from NOR elements 28, 28, respectively. To the respective input terminals of these NOR elements 28, 28, ..., main word lines $\overline{MWL\phi}$, ..., $\overline{MWLn}$ and section select lines $SS\phi$, ..., $SSs$ are connected.

Figure 18:
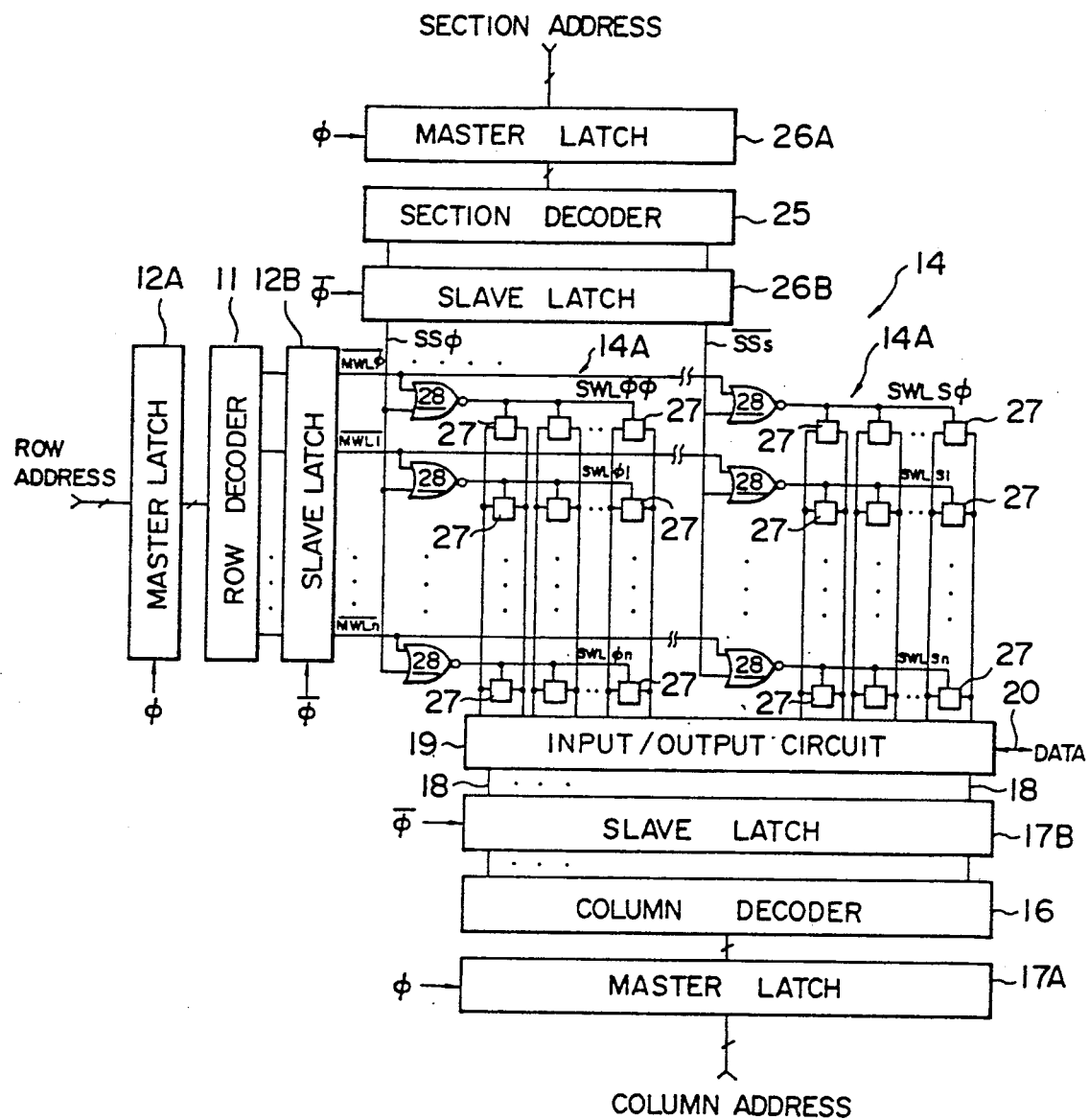
Figure 19:
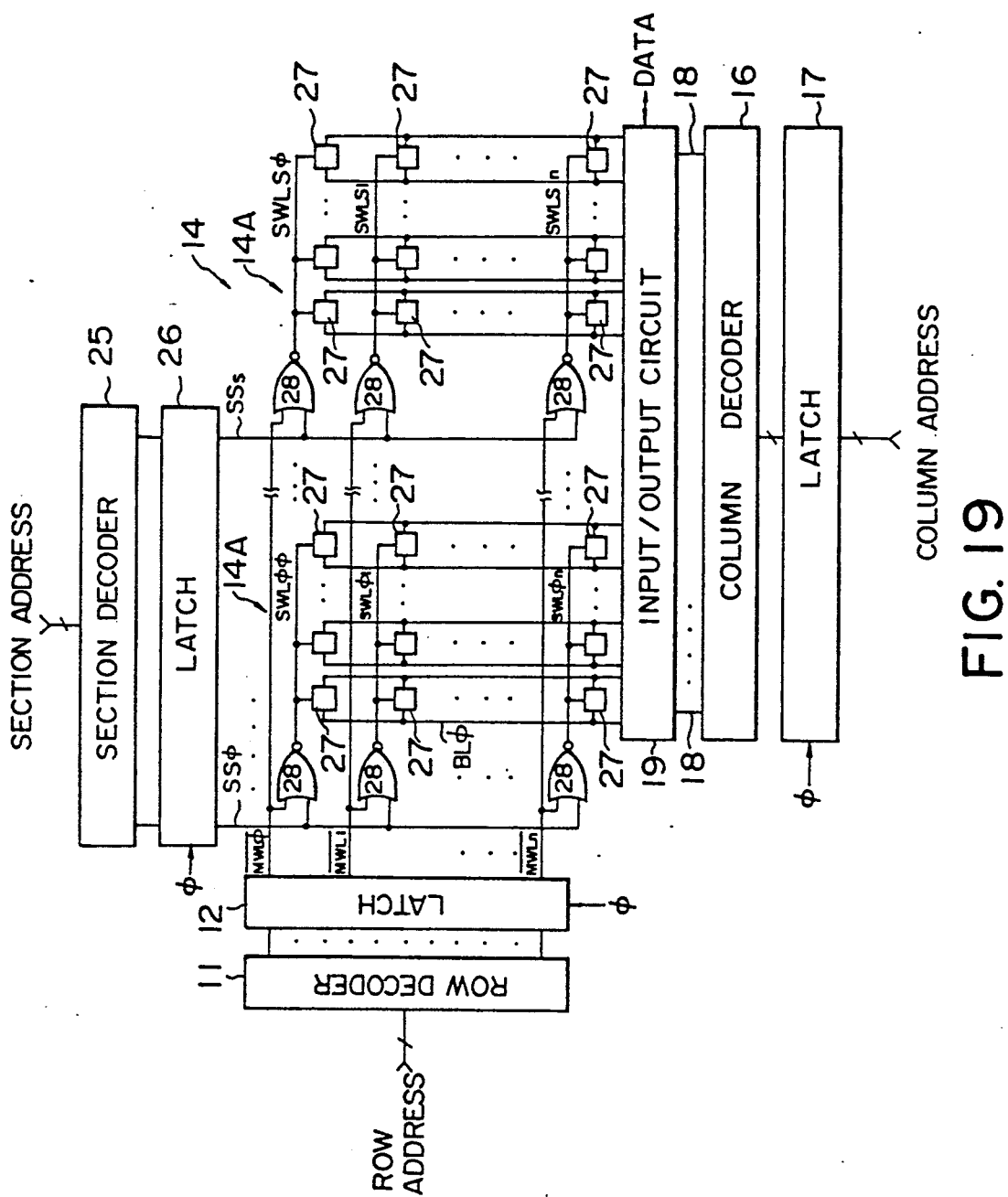
Figure 20:
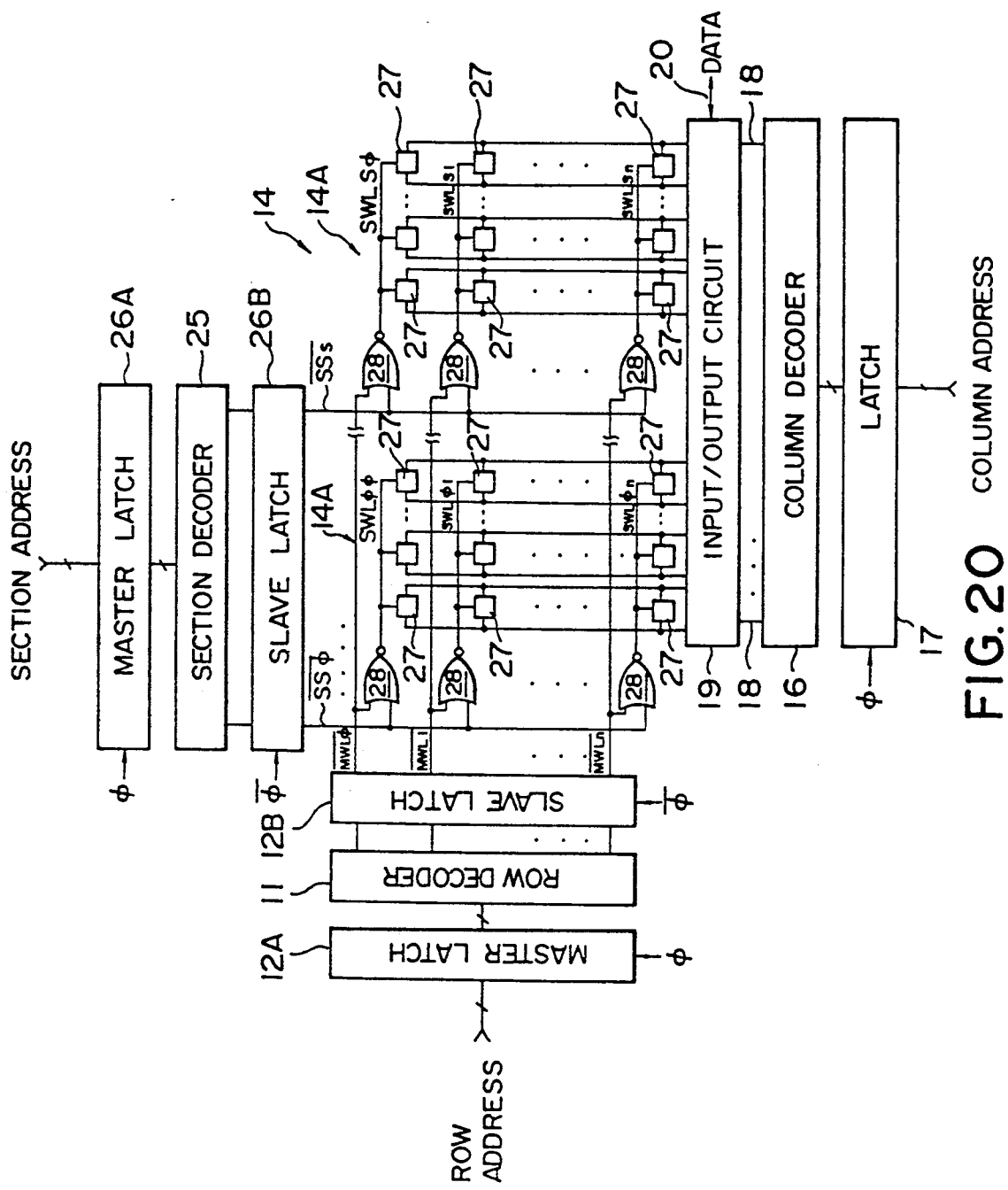

In such a double word line structure, one NOR element 28 is selected by outputs from the latches 12, 26. By an output from the selected NOR element 28, one of the word lines (SWLφ~n to SWLS1~n) is selected. The circuit configuration shown in FIG. 17 can also shorten the cycle time in the same manner as that in the circuit arrangement shown in FIG. 1.

Where the address setup time $t_{as}$ is shorter than the address decode time $t_{dec}$ in the circuit configuration shown in FIG. 17, it is sufficient that the circuit configuration shown in FIG. 17 is changed to the circuit configuration shown in FIG. 18 as indicated by the relationship between the circuit configuration shown in FIG. 1 and that shown in FIG. 8. In this case, the latch 26 shown in FIG. 17 is composed of a master latch 26A and a slave latch 26B which are shown in FIG. 18. These latches 26A, 26B are connected before and after the section decoder 25.

Where it is not necessarily required to apply pipe-line processing to the column system in FIGS. 17 and 18, a latch 17 may be arranged at the preceding stage of the column decoder 16 in the column system as shown in FIGS. 19 and 20 with the same relationship as the relationship between the circuit configurations shown in FIGS. 1 and 15 and the relationship between the circuit configurations shown in FIGS. 8 and 16.

Figure 21:
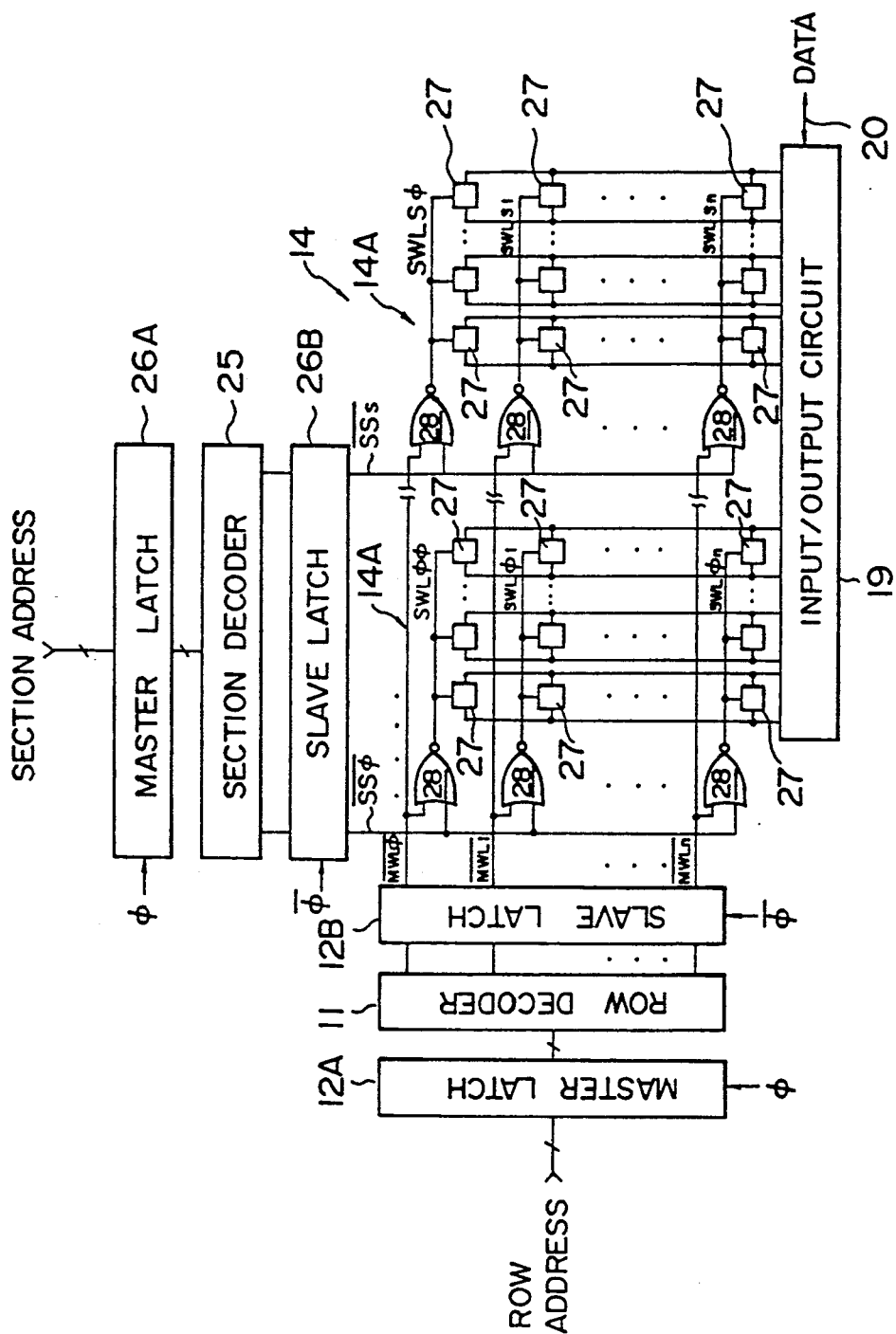

In the case where the number of bits accessed is large and cells activated by one section are all accessed, column decoder 26 is unnecessary. In that case, it is sufficient that the circuit configuration of FIG. 18 is changed to that shown in FIG. 21.

It is to be noted that while the designation of cells in the case of data read operation has been principally described above, designation of cells in the case of data write operation may be conducted in the same manner.

Figure 27:
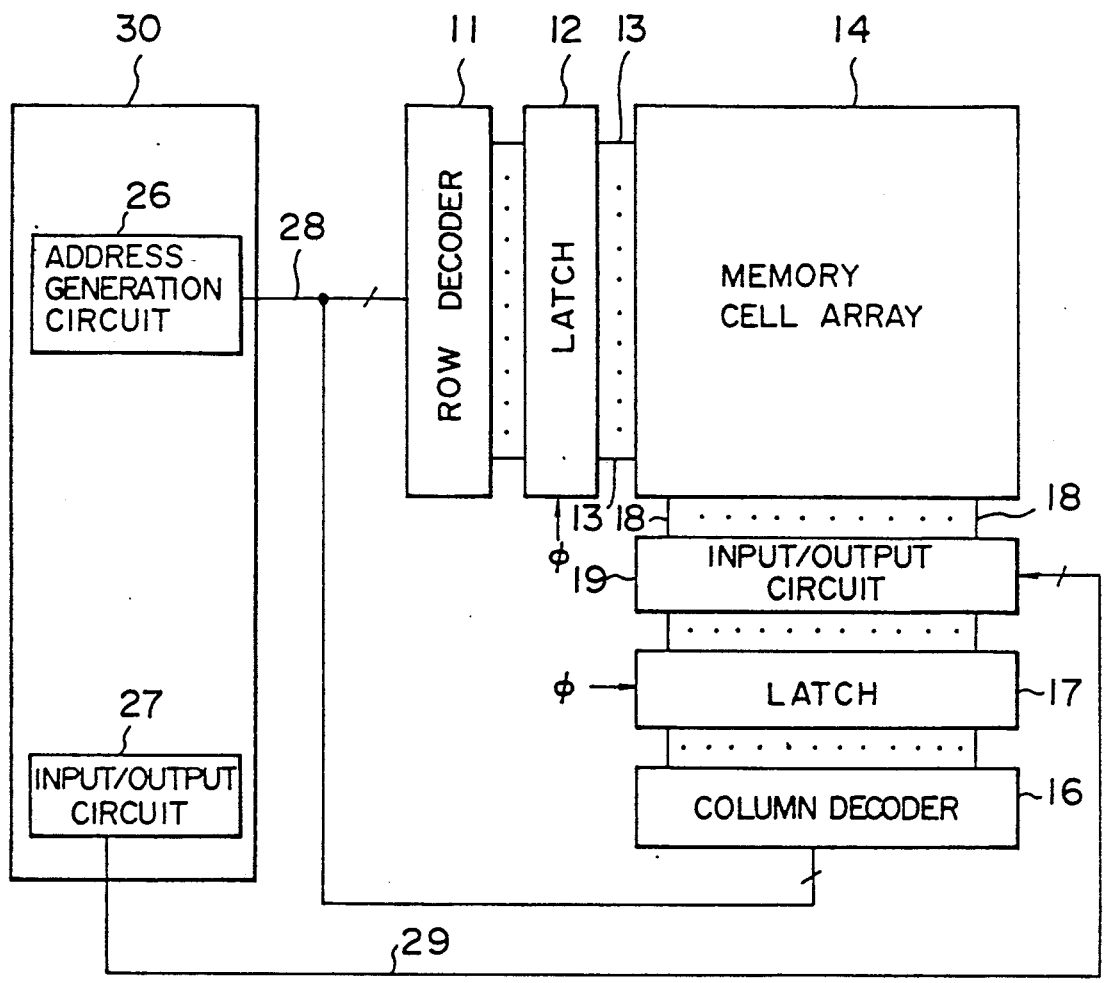
FIGS. 27 to 30 are block diagrams of embodiments where data processing units are additionally provided in the configurations shown in FIGS. 1, 17, 8 and 18, respectively.
Figure 28:
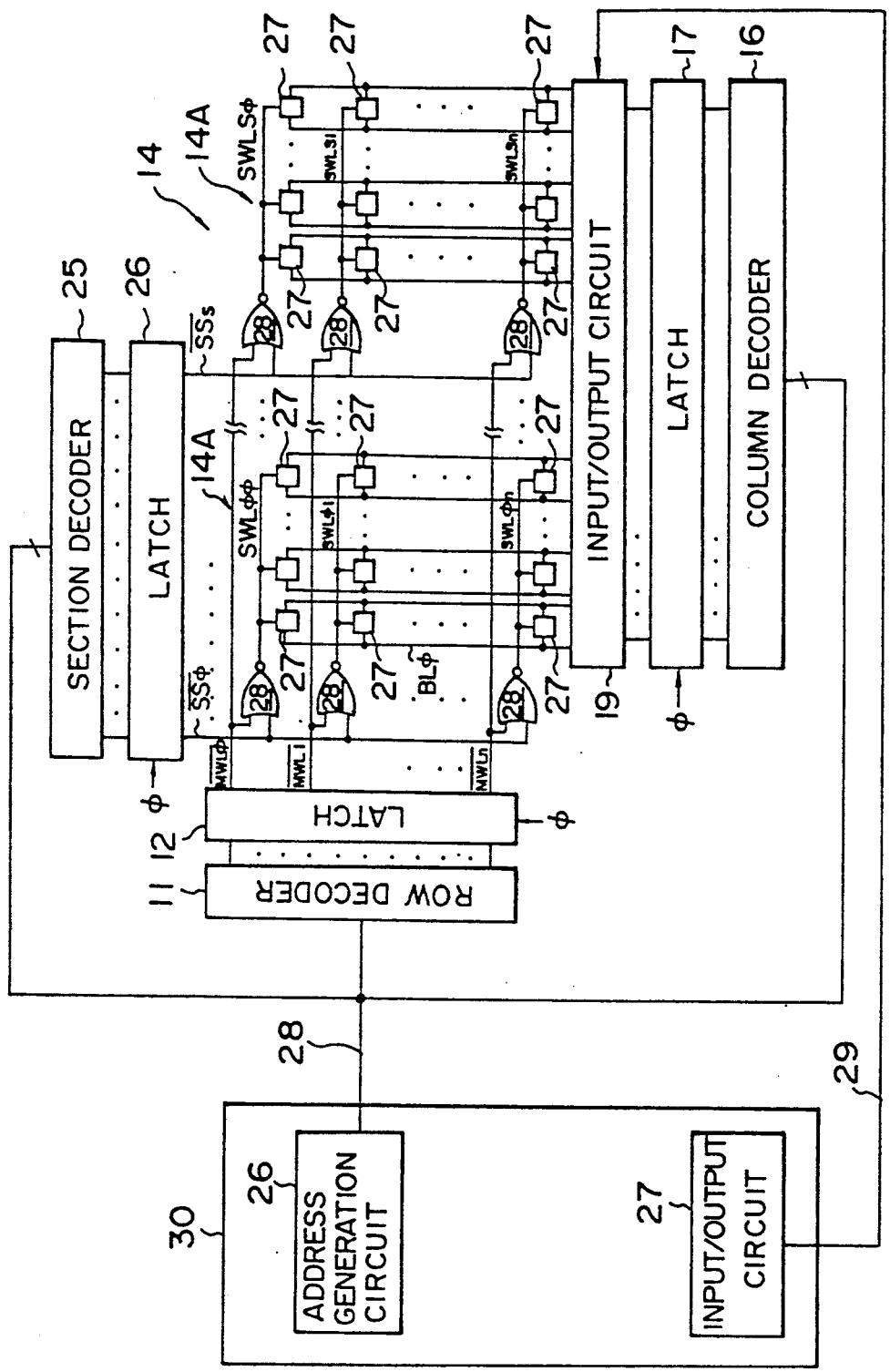

Referring to FIGS. 27 and 28, there are shown still further embodiments of this invention where a data processing unit 30 such as a microprocessor, etc. is provided. In these embodiments, an address generation circuit 26 within the data processing unit 30 such as a microcomputer, etc. and row decoder 11 provided in association with the memory are interconnected through an address bus 28, and input/output circuit 19 provided in association with the memory and an input/output circuit 27 (for driving the input/output circuit 19) are interconnected through an address bus 29.

By employing such a configuration, the address generation circuit 26 within the data processing unit 30 and the address decoders 11, 16 provided in association with the memory are directly connected without intervention of latch. Accordingly, an address generated in the address generation circuit 26 within the data processing unit 30 is immediately decoded at the address decoders 11, 16. Thus, in the case of applying pipe-line processing to address generation and memory access, operation up to the address decoding can be completed by the pipeline processing for the address generation. In a system using a large capacity memory, there are instances where the cycle time of a large capacity memory determines the cycle time of the system. In such instances, when these embodiments are employed, it is possible to shorten the cycle time by the address decode time as compared to that of the conventional memory and without the addition of a special restriction.

Figure 29:
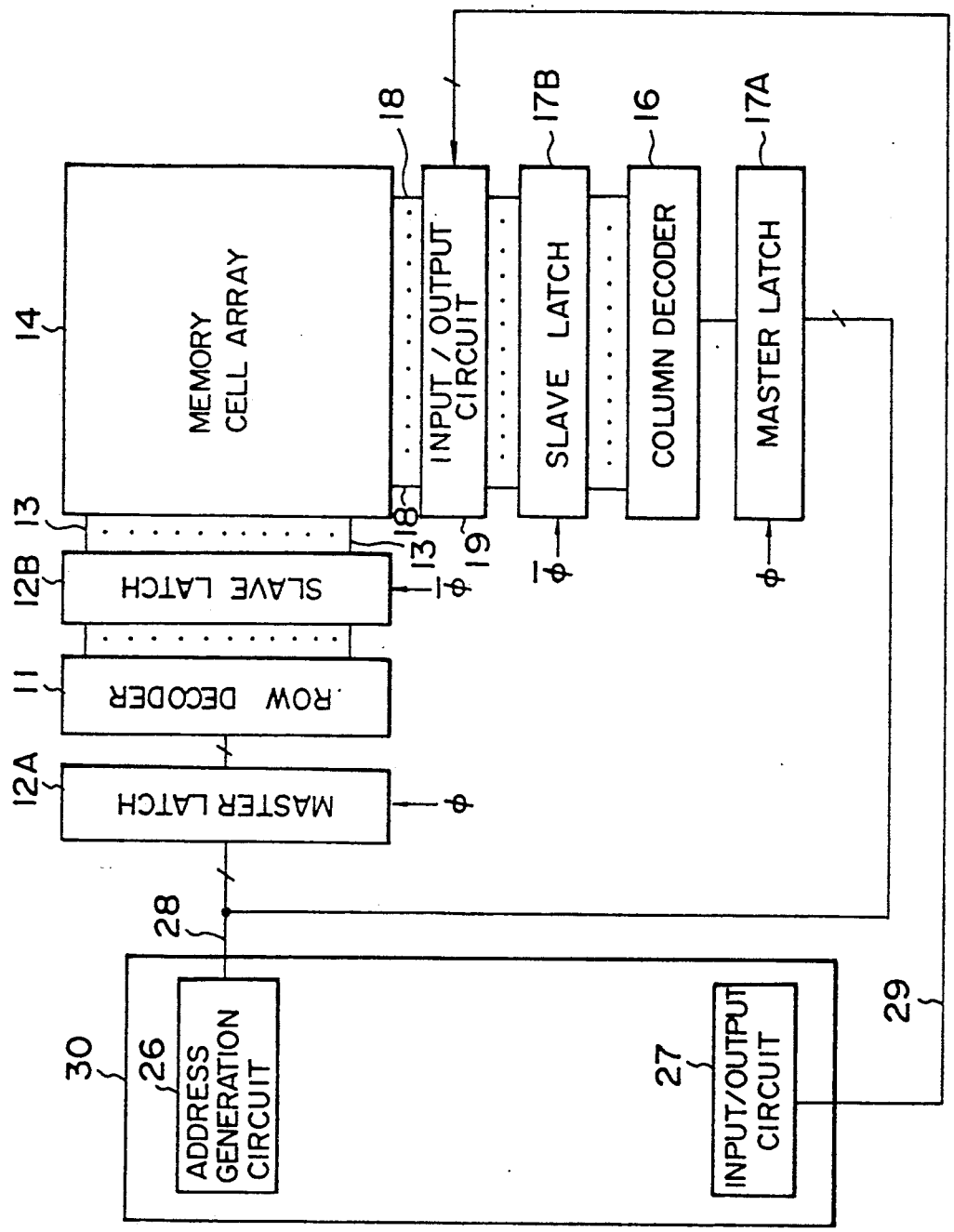
Figure 30:
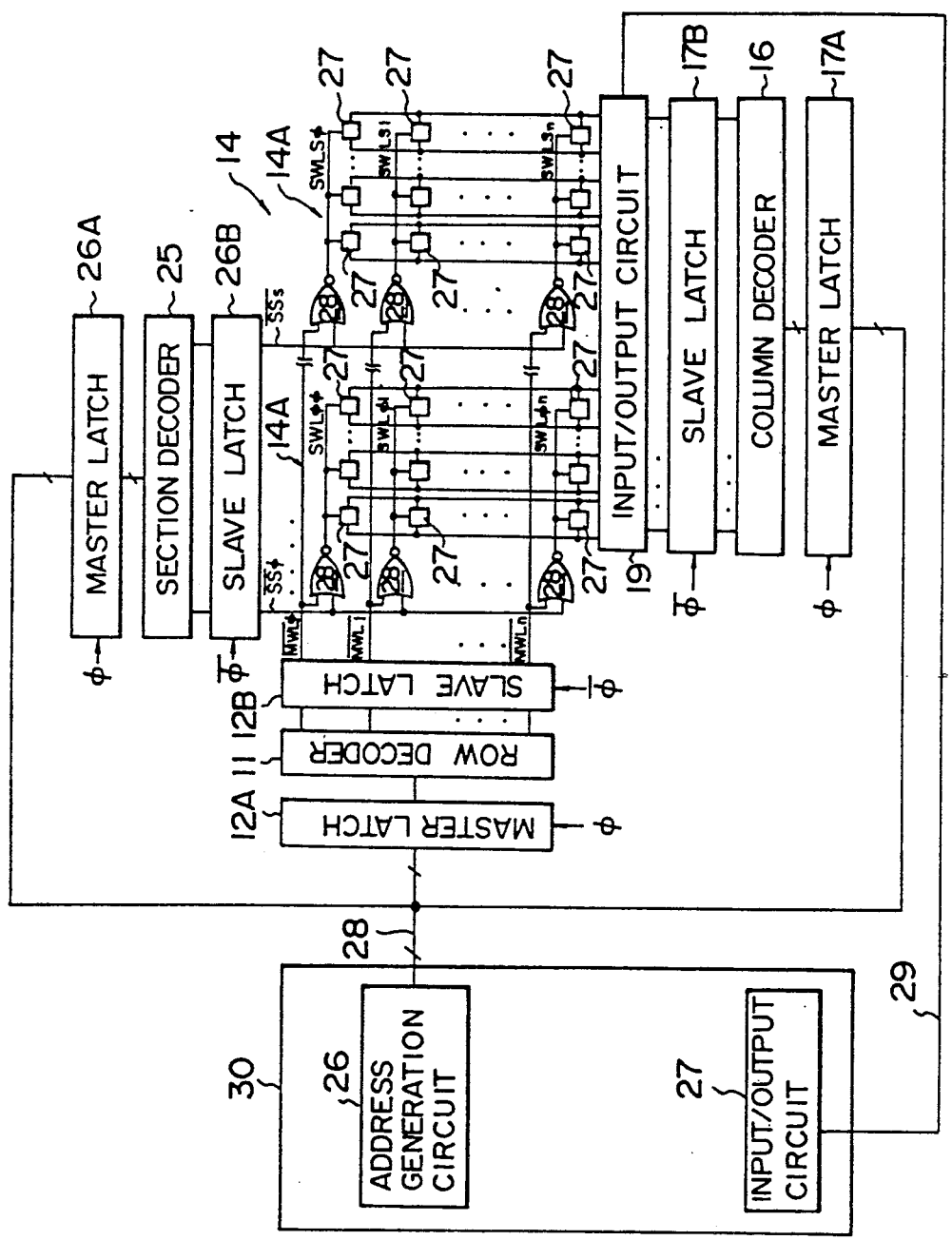

Finally, referring to FIGS. 29 and 30, there are shown still more further embodiments of this invention where a data processing unit is provided. In these embodiments, the address generation circuit 26 within the data processing unit 30 and a master latch 12A provided in association with the memory are interconnected through the address bus 28, and an input/output circuit 19 provided in association with the memory and input/output circuit 27 within the data processing unit 30 are interconnected through the data bus 29.

By employing such a configuration, while an address outputted from the address generation circuit 26 is generally established within the cycle time, even if address decoding is not established within the cycle time, there is no possibility that erroneous operation will occur. Accordingly, address decoding can be carried out over cycles. Thus, a sequence comprising the steps of address generation, address decoding, and memory access can be executed in two cycles in a time as short as possible. Namely, the critical path of the system can be optimized over cycles.

What is claimed is:

1. A semiconductor memory device comprising:
    a master latch circuit operative to receive a row address signal to latch said row address signal at the first half of one cycle of a synchronizing signal, and to output said row address signal as it is at the latter half of one cycle of said synchronizing signal;
    a row decoder operative to receive the row address signal outputted from said master latch circuit to decode it into a row decoded signal, to thus output said row decoded signal;
    a slave latch circuit operative to receive the row decoded signal outputted from said row decoder to latch said row decoded signal at the latter half of one cycle of said synchronizing signal, and to output said row decoded signal as it is at the first half of one cycle of said synchronizing signal, to thus drive one of a plurality of word lines; and
    a memory cell array including a plurality of memory cells connected to said word lines, respectively, each memory cell being operative to carry out input/output operation of data when a word line to which said each memory cell is connected is driven.

2. A device as set forth in claim 1, wherein input/output operation of data in said memory cell is conducted through an input/output operation circuit.

3. A device as set forth in claim 2, which further comprises:
    a master latch circuit operative to receive a column address signal to latch said column address signal at the first half of one cycle of the synchronizing signal, and to output said column address signal as it is at the latter half of one cycle of said synchronizing signal;
    a column decoder operative to receive a column address signal outputted from said master latch circuit to decode said column address signal into a column decoded signal, to thus output said column decoded signal; and
    a slave latch circuit operative to receive the column decoded signal outputted from said column decoder to latch said column decoded signal at the latter half of one cycle of said synchronizing signal, and output said column decoded signal as it is at the first half of one cycle of said synchronizing signal, to thus select one of said plurality of bit lines ;
    a memory cell connected to said selected bit line of the memory cells connected to said driven word line being subject to input/output operation of said data.

4. A device as set forth in claim 3, which further comprises a data processing unit having an address generation circuit for outputting said row address signal, and said column address signal, said address generation circuit being connected to said rerspective two master latch circuits on the row and column sides through a data bus.

5. A device as set forth in claim 2, which further comprises:
- a latch circuit operative to receive a column address signal to latch said column address signal in synchronism with a synchronizing signal; and
- a column decoder operative to receive the column address signal from said latch circuit to decode said column address signal to output it as a column decoded signal, to thus select one of a plurality of bit lines;
- a memory cell connected to said selected bit line of the memory cells connected to said driven word line being subjected to input/output operation of said data.

6. A device as set forth in claim 1, which further comprises a data processing unit having an address generation circuit for outputting said row address signal, said address generation circuit being connected to said master latch circuit through a data bus.

7. A semiconductor memory device comprising:
- a row decoder operative to receive a row address signal to decode said row address signal to output it as a row decoded signal;
- a latch circuit operative to latch the row decoded signal from said row decoder in synchronism with a synchronizing signal, to thus drive a main word line (MWL);
- a section decoder operative to receive a section address signal to decode said section address signal to output it as a section decoded signal;
- a latch circuit operative to latch the section decoded signal from said section decoder in synchronism with said synchronizing signal, to thus drive a section select line;
- a plurality of logic circuits for performing a logic operation between said main word line (MWL) and said section select line (SS) wherein when said main word line (MWL) and said section select line (SS) are both in a drive state, each logic circuit is operative to output a section word line drive signal for driving one of said plurality of section word lines (SWL); and
- a memory cell array including a plurality of memory cells connected to said section word lines (SWL), respectively, each memory cell being operative to carry out input/output operation of data when a section word line (SWL) to which said each memory cell is connected is driven.

8. A device as set forth in claim 7, wherein input/output operation of data in said memory cell is carried out through an input/output operation circuit.

9. A device as set forth in claim 8, which further comprises:
- a column decoder operative to receive a column address signal to decode said column address signal to output it as a column decoded signal; and
- a latch circuit operative to latch the column decoded signal from said column decoder in synchronism with a synchronizing signal to select one of said plurality of bit lines;
- a memory cell connected to said selected bit line of the memory cells connected to said driven section word line (SWL) being subjected to input/output operation of said date.

10. A device as set forth in claim 9, which further comprises a data processing unit having an address generation circuit for outputting said row address signal, said section address signal, and said column address signal, said address generation circuit being connected to said row decoder, said section decoder and said column decoder through a data bus.

11. A device as set forth in claim 8, which further comprises:
- a latch circuit operative to receive a column address signal to latch said column address signal in synchronism with a synchronizing signal; and
- a column decoder operative to receive the column address signal from said latch circuit to decode said column address signal to output it as a column decoded signal, to thus select one of said plurality of bit lines;
- a memory cell connected to said selected bit line of the memory cells connected to said driven section word line (SWL) being subjected to input/output operation of said data.

12. A device as set forth in claim 7, which further comprises a data processing unit having an address generation circuit for outputting said row address signal and said section address signal, said address generation circuit being connected to said row decoder and said column decoder through a data bus.

13. A semiconductor memory device comprising:
- a master latch circuit operative to receive a row address signal to latch said row address signal at the first half of one cycle of a synchronizing signal, and to output said row address signal as it is at the latter half of one cycle of said synchronizing signal;
- a row decoder operative to receive the row address signal outputted from said master latch circuit to decode said row address signal into a row decoded signal to output said row decoded signal;
- a slave latch circuit operative to receive the row decoded signal outputted from said row decoder to latch said row decoded signal at the latter half of one cycle of said synchronizing signal, and to output said row decoded signal as it is at the first half of one cycle of said synchronizing signal, to thus drive one of main word lines (MWL);
- a master latch circuit operative to receive a section address signal to latch said section address signal at the first half of one cycle of said synchronizing signal, and to output said section address signal as it is at the latter half of one cycle of said synchronizing signal;
- a section decoder operative to receive the section address signal outputted from said master latch circuit to decode said section address signal into a section decoded signal to output said section decoded signal;
- a slave latch circuit operative to receive the section decoded signal outputted from said section decoder to latch said section decoded signal at the latter half of one cycle of said synchronizing signal, and to output said section decoded signal as it is at the first half of one cycle of said synchronizing signal, to thus drive one of section select lines (SS);
- a plurality of logic circuits for performing a logic operation between said main word lines (MWL)

and said section lines (SS) wherein when said main word lines (MWL) and said section select lines are both in a drive state, each logic circuit is operative to output a section word line drive signal for driving one of said plurality of section word lines (SWL); and a memory cell array including a plurality of memory cells connected to said section word lines (SWL), respectively, each memory cell being operative to carry out input/output operation of data when a section word line (SWL) to which said each memory cell is connected is driven.

14. A device as set forth in claim 13, wherein the input/output operation of data in said memory cell is conducted through an input/output operation circuit.

15. A device as set forth in claim 14, which further comprises:

a master latch circuit operative to receive a column address signal to latch said column address signal at the first half of one cycle of said synchronizing signal, and to output said column address signal as it is at the latter half of one cycle of said synchronizing signal;

a column decoder operative to receive a column address signal outputted from said master latch circuit to decode it into a column decoded signal to output said column decoded signal; and a slave latch circuit operative to receive the column decoded signal outputted from said column decoder to latch said column decoded signal at the latter half of one cycle of said synchronizing signal, and to output said column decoded signal as it is at the first half of one cycle of said synchronizing signal;

a memory cell connected to said selected bit line of the memory cells connected to said driven section word line (SWL) being subjected to input/output operation of said data.

16. A device as set forth in claim 15, which further comprises a data processing unit having an address generation circuit for outputting said row address signal, said section address signal, and said column address signal, said address generation circuit being connected to said respective three master latches on the row, section and column sides through a data bus.

17. A device as set forth in claim 14, which further comprises:

a latch circuit operative to receive a column address signal to latch said column address signal in synchronism with a synchronizing signal; and a column decoder operative to receive a column address signal from said latch circuit to decode said column address signal to output it as a column decoded signal, to thus select one of said plurality of bit lines;

a memory cells connected to said selected bit line of the memory cells connected to said driven section word line (SWL) being subjected to input/output operation of said data.

18. A device as set forth in claim 13, which further comprises a data processing unit having an address generation circuit for outputting said row address signal, and said section address signal, said address generation circuit being connected to said respective two master latch circuits on the row and section sides through a data bus.

* * * * *